United States Patent
Tymofieiev

(10) Patent No.: US 12,010,784 B2
(45) Date of Patent: Jun. 11, 2024

(54) WIRELESS SYNCHRONIZATION FOR MULTI-CHANNEL RF HEATING AND DRYING DEVICES

(71) Applicant: Ampleon Netherlands B.V., Nijmegen (NL)

(72) Inventor: Yevhen Tymofieiev, Nijmegen (NL)

(73) Assignee: Ampleon Netherlands B.V., Nijmegen (NL)

( * ) Notice: Subject to any disclaimer, the term of this patent is extended or adjusted under 35 U.S.C. 154(b) by 608 days.

(21) Appl. No.: 17/189,703

(22) Filed: Mar. 2, 2021

(65) Prior Publication Data
US 2021/0282237 A1 Sep. 9, 2021

(30) Foreign Application Priority Data
Mar. 3, 2020 (NL) ...................................... 2025039

(51) Int. Cl.
*H05B 6/72* (2006.01)
*H01Q 1/02* (2006.01)
(Continued)

(52) U.S. Cl.
CPC ................ *H05B 6/72* (2013.01); *H01Q 1/02* (2013.01); *H03F 3/245* (2013.01); *H05B 6/686* (2013.01)

(58) Field of Classification Search
CPC . G06T 2207/10021; G06T 2207/10024; G06T 2207/10028; G06T 7/579; G06T 7/74; G06V 20/52; H01Q 1/02; H03F 3/245; H05B 6/686; H05B 6/705; H05B 6/72; Y02B 40/00

(Continued)

(56) References Cited

U.S. PATENT DOCUMENTS

| 7,724,204 B2 * | 5/2010 | Annamaa ............. H01Q 1/2291 343/851 |
| 10,143,045 B2 | 11/2018 | Wesson et al. |
| 11,013,073 B2 * | 5/2021 | Koetz ...................... H05B 6/70 |

FOREIGN PATENT DOCUMENTS

| EP | 2051564 A1 | 4/2009 |
| JP | 2008269793 A | 11/2008 |
| WO | 2018125182 A1 | 7/2018 |

OTHER PUBLICATIONS

Search Report and Written Opinion for Netherlands Application No. 2025039, dated Oct. 21, 2020, mailed 7 pages.

* cited by examiner

*Primary Examiner* — Quang T Van
(74) *Attorney, Agent, or Firm* — McDonnell Boehnen Hulbert & Berghoff LLP

(57) ABSTRACT

Example embodiments relate to wireless synchronization for multi-channel RE heating and drying devices. One embodiment includes a multi-channel RF device. The RE device includes a cavity. The RF device also includes a first channel configured to generate a first RF signal and to transmit the first RE signal into the cavity. In addition, the RE device includes a second channel spaced apart and electrically isolated from the first channel. The second channel is configured to wirelessly receive the first RE signal transmitted by the first channel. The second channel is also configured to extract a frequency of the first RE signal from the received first RE signal. In addition, the second channel is configured to generate, based on the extracted frequency, a second RE signal. Further, the second channel is configured to transmit the second RE signal into the cavity.

20 Claims, 4 Drawing Sheets

(51) Int. Cl.
*H03F 3/24* (2006.01)
*H05B 6/68* (2006.01)

(58) Field of Classification Search
USPC ....... 219/748, 702, 745, 746, 750, 756, 678,
219/679, 690, 695, 696, 686
See application file for complete search history.

WIRELESS SYNCHRONIZATION FOR MULTI-CHANNEL RF HEATING AND DRYING DEVICES

CROSS-REFERENCE TO RELATED APPLICATIONS

The present application is a non-provisional patent application claiming priority to Netherlands Patent Application No. NL 2025039, filed Mar. 3, 2020, the contents of which are hereby incorporated by reference.

FIELD OF THE DISCLOSURE

The present disclosure relates to a multi-channel RF device for heating and drying applications. More in particular, the present disclosure relates to synchronization for a multi-channel RF device for heating and drying applications. More in particular, the present disclosure relates to a solid-state cooking device, and synchronization for a solid-state cooking device.

BACKGROUND

A multi-channel radio frequency (RF) device configured for heating and drying applications may use electromagnetic (EM) energy to heat or dry a certain product. Multi-channel RF devices may be used for several industrial, scientific and medical (ISM) applications, such as defrosting applications, medical applications, cooking applications, and applications involving materials such as ceramic or wood products. For example, if the multi-channel RF device is a solid-state cooking (SSC) device, then said device may be used for cooking a food product.

Generally, a multi-channel RF device for heating and drying applications comprises a cavity in which the product is subjected to EM energy, and a plurality of spaced apart RF channels which generate and transmit the EM energy into the cavity in the form of an RF signal. Most of the modern multi-channel RF devices use two, four or even more RF channels to spread and steer the EM fields in the cavity.

In use, all RF channels of the multi-channel RF device must be frequency-synchronized for several technical reasons. One reason is that non-synchronized channels may cause intermodulation products due to mismatch in frequency combined with signal leakage to any non-linear components in the channels, resulting in out-of-band emission. Regulations generally prohibit out-of-band emission, or restrict it to a certain maximum power. Therefore, out-of-band emission is to be avoided or minimized. This may be achieved by limiting the signal leakage between channels through the use of one or more isolators, such as circulators. However, the shielding from this leakage that is provided by said isolators is typically not sufficient to fulfill the emission regulations. Therefore, frequency synchronization between channels is preferred.

One method of frequency synchronization for multi-channel RF devices known from the prior art comprises wired RF synchronization, that is, wherein an RF signal is generated by a common unit that shares the generated RF signal among a plurality of channels, wherein each channel may comprise an amplifier. This approach may be feasible in devices where the RF channels are placed very close to each other. However, significant disadvantages are that an RF splitter is required, and that a physical transmission line, such as a coaxial cable, is necessary when the RF channels are spaced apart from each other.

Another method of frequency synchronization for multi-channel RF devices known from the prior art comprises low-frequency synchronization, that is, wherein a local oscillator (LO) signal of a first channel, which acts as a master channel, is shared with one or more second channels, which act as slave channels, through a wired connection. For multi-channel devices, a low-frequency (LF) splitter and associated physical transmission line are required for each slave channel. In addition, accurate frequency programming per channel is required for the second channels in order to minimize intermodulation products.

For both prior art approaches, it is difficult and/or costly to extend multi-channel RF devices to comprise a large number of channels, e.g. two or more.

SUMMARY

It is an object of the present disclosure to provide a multi-channel RF device in which the abovementioned problems do not or hardly occur.

This object is achieved with the multi-channel RF device according to claim 1 that is characterized in that the second channel is configured to wirelessly receive the first RF signal transmitted by the first channel, to extract a frequency of the first RF signal from the received first RF signal, to generate, based on the extracted frequency, a second RF signal, and to transmit the second RF signal into the cavity.

By wirelessly synchronizing the first channel with the second channel(s), no RF hardware is required between any of the first and second channels, and no frequency programming is required for the second channel(s). Wireless synchronization could bring down costs significantly in multi-channel RF devices, where signal sources are physically separated.

Preferably, the first and second channels are electrically isolated from each other. Within the context of the present disclosure, channels are electrically isolated when there is no wired connection between the channels other than for instance a ground connection, a supply connection or a control interface connection.

The device can be configured to be operational in a first mode and a second mode. The first mode may be referred to as the synchronization mode. In the synchronization mode, the first channel may be configured to transmit a pilot tone as the first RF signal, and the second channel may be configured to receive the pilot tone and to extract the frequency of the pilot tone. In the second mode, the first channel may be configured to transmit a first modulated RF signal as the first RF signal, and the second channel may be configured to transmit a second modulated RF signal as the second RF signal. The first modulated RF signal may relate to a first carrier signal having a frequency identical to the frequency of the pilot tone. The first carrier signal is modulated to obtain the first modulated RF signal. The second modulated RF signal may relate to a second carrier signal having a frequency identical to the extracted frequency of the pilot tone. The second carrier signal is modulated to obtain the second modulated RF signal.

The second mode may be referred to as the heating mode or the drying mode, depending on the application for the device. If the multi-channel RF device is an SSC device, then the second mode may also be referred to as the cooking mode.

By modulating the RF signals that are sent into the cavity, the situation can be prevented in which hot spots are formed in the product to be heated/dried, thereby allowing a more uniform heating/drying process.

The device may be configured to be alternately in the synchronization mode and the second mode and to be repeatedly in the synchronization mode during a single heating or drying operation. That is, a heating or drying operation may comprise repeatedly alternating between the synchronization mode and the second mode. Within a heating or drying operation, the second mode generally follows after the synchronization mode, and vice versa. If the device is an SSC device, the heating operation may also be referred to as a cooking operation. Hereinafter, a drying, heating or cooking operation is referred to as an 'operation'.

The synchronization mode may be performed during a first time interval and the second mode during a second time interval. Furthermore, a combined sum of the second time intervals associated with the second mode during said single operation may be user-definable. For example, a user may set the number of second time intervals required for the operation by means of defining the desired heating/drying time. Furthermore, at least one of the first time interval and the second time interval may be user-definable. In some embodiments, the synchronization between channels may deteriorate over time. In such cases, it may be preferable to reduce the second time interval.

The first channel may comprise a first signal synthesizer unit and a first antenna. The first signal synthesizer unit may be configured to generate the first RF signal and to transmit the first RF signal into the cavity using the first antenna. The second channel may comprise a second signal synthesizer unit and a second antenna. The second channel may be configured to use the second antenna to wirelessly receive the first RF signal transmitted by the first channel when the device is operating in the synchronization mode. The second signal synthesizer unit may be configured to extract, in the synchronization mode, said frequency of the first RF signal from the received first RF signal, to generate, in the second mode and using the extracted frequency, said second RF signal, and to transmit, in the second mode, the second RF signal into the cavity using the second antenna.

The second channel may further comprise a coupler being electrically connected to an output of the second signal synthesizer unit, to an input of the second signal synthesizer unit, and to the second antenna. The coupler may be configured to couple the first RF signal that is received by the second antenna to the input of the second signal synthesizer unit in the synchronization mode, and to couple an output of the second signal synthesizer unit to the second antenna in the second mode.

The second signal synthesizer unit may comprise a switchable first phase-locked loop (PLL). The first PLL may be configured to generate, in the synchronization mode, the second RF signal by phase-locking to the signal received at the input of the second signal synthesizer unit, and to, in the second mode, maintain generating the second RF signal irrespective of the signal received at the input of the second signal synthesizer unit. The first PLL may be implemented as one of an analog PLL, an all-digital PLL (ADPLL), a field-programmable gate array (FPGA)-implemented PLL, a direct digital synthesizer (DDS), and a combination of a DDS and a PLL.

The second signal synthesizer unit may further comprise a first fractional divider connected to an input of the first PLL. The first fractional divider may be configured to output, to the input of the first PLL, a signal having a frequency equal to the frequency of the signal received at the input of the second signal synthesizer unit divided by a factor M. The first PLL may comprise a first phase detector having a first and second input, and can be configured to output a first phase error signal comprising a phase error between a first and second input signal received at said first and second input of the first phase detector, respectively. The first PLL may further comprise a sample-and-hold circuit configured to sample said first phase error signal in the synchronization mode, and to hold said first phase error signal in the second mode. Furthermore, the first PLL may comprise a first voltage-controlled oscillator (VCO) configured to generate, in the synchronization mode, the second RF signal at an output of the first PLL using the sampled first phase error signal, and to generate, in the second mode, the second RF signal at the output of the first PLL using the held first phase error signal. Furthermore, the first PLL may comprise a second fractional divider configured to output, using the second RF signal as its input, a signal having a frequency equal to the frequency of the second RF signal divided by the factor M. The first input signal of the first phase detector may be the output signal of the first fractional divider, and the second input signal of the first phase detector may be the output signal of the second fractional divider. The first input of the first phase detector may be identical or connected to the input of the first PLL.

The first PLL may further comprise a first low-pass filter arranged in between an output of the first phase detector and the sample-and-hold circuit to generate a first filtered phase error signal using said first phase error signal, which is to be sampled or held by the sample-and-hold circuit. This first low-pass filter may improve the loop stability of the phase-locked loop.

The second signal synthesizer unit may further comprise a first amplifier arranged in between the output of the first PLL and the coupler. The first amplifier may be configured for amplifying, in the second mode, the second RF signal before transmitting the second RF signal into the cavity using the second antenna. The second signal synthesizer unit may be configured to prevent or limit the second RF signal from reaching the second antenna in the synchronization mode. For example, the first amplifier may be configured to be shut down in the synchronization mode.

The second signal synthesizer unit may be configured to modulate the second RF signal in the second mode. For example, the second signal synthesizer unit may further comprise a mixer for mixing the second RF signal with a baseband signal in the second mode. Alternatively, the second signal synthesizer unit may be configured to, in the second mode, vary a phase delay and/or an amplification of the first amplifier in dependence of a baseband signal. The modulation of the second RF signal may have a modulation bandwidth that is sufficiently narrow such that the resulting intermodulation products do not result in out-of-band emission.

The first signal synthesizer unit may comprise a local oscillator (LO) configured to generate a reference signal, a second PLL configured to generate the first RF signal using the reference signal, and a second amplifier configured to amplify the first RF signal and to output the amplified first RF signal to the first antenna. The second PLL may be implemented as one of an analog PLL, an all-digital PLL (ADPLL), a field-programmable gate array (FPGA)—implemented PLL, a direct digital synthesizer (DDS), and a combination of a DDS and a PLL.

The second PLL may comprise a second phase detector having a first and second input and can be configured to output a second phase error signal comprising a phase error between a first and second input signal received at the first and second input of the second phase detector, respectively. The second PLL may further comprise a second low-pass filter configured to generate a second filtered phase error signal using said second phase error signal, a second VCO configured to generate, at an output of the second PLL, the first RF signal using said second filtered phase error signal, and a third fractional divider configured to output, using the first RF signal as its input, a signal with a frequency equal to the frequency of the first RF signal divided by a factor N. The first input signal of the second phase detector may be the reference signal generated by the LO, and the second input signal of the second phase detector may be the output signal of the third fractional divider.

The reference signal generated by the LO may have a signal frequency in a range between 1-100 MHz, preferably between 5-20 NMz, more preferably between 8-12 NMz.

The frequency of the first RF signal may be user-definable by configuring the factor N of the third fractional divider.

The device may comprise a first semiconductor die on which a first integrated circuit block is realized, the first integrated circuit block comprising the second signal synthesizer unit and a local oscillator that is connected to the first input of the first phase detector. The device may further comprise a second semiconductor die on which a second integrated circuit block is realized that is identical to the first integrated circuit block. For the purpose of forming the first signal synthesizer unit, the first fractional divider can be disabled, and the sample-and-hold circuit can be set to the sampling mode only. For the purpose of forming the second signal synthesizer unit the local oscillator can be disabled. In this manner, the number of different components in the device can be minimized. A single semiconductor die and/or integrated circuit block can be used to realize both the first and second signal synthesizer units, albeit not simultaneously.

The first signal synthesizer unit may be configured to modulate the first RF signal in the second mode. For example, the first signal synthesizer unit may further comprise a mixer for mixing the first RF signal with a baseband signal in the second mode. Alternatively, the first signal synthesizer unit may be configured to vary, in the second mode, a phase delay and/or an amplification of the second amplifier in dependence of a baseband signal. The modulation of the second RF signal may have a modulation bandwidth that is sufficiently narrow such that the resulting intermodulation products do not result in out-of-band emission.

The device may comprise a controller for controlling the first and second signal synthesizer units. For example, the controller may be configured to set the in the synchronization mode by disabling the modulation of the first and second RF signals, and to set the device in the second mode by enabling the modulation of the first and second RF signals. Said setting the device in the synchronization mode may further comprise setting the sample-and-hold circuit in a sampling mode and said setting the device in the second mode may further comprise setting the sample-and-hold circuit in a holding mode. Said setting the device in the synchronization mode may further comprise controlling the second channel to prevent or limit the second RF signal from reaching the second antenna.

The first and second signal synthesizer units may be formed by an identical integrated circuit block preferably arranged on different semiconductor dies. For the first channel, the sample-and-hold circuit is set to operate in the sampling mode only and the first fractional divider, of which the output is connected to the phase detector, is not used. For the second channel, the local oscillator is disabled. In this manner, the number of different parts in the device can be minimized.

The frequency of the first RF signal may be configured to fall within an ISM radio band. For example, the frequency of the first RF signal may be configured to be in one of a range from 433.05-434.79 MHz, a range from 902-928 MHz, a range from 2.4-2.5 GHz, or a range from 5.725-5.875 GHz.

The device may comprise a plurality of said second channels. For example, there may be three second channels, each of which is capable of synchronizing with the first channel as described above.

BRIEF DESCRIPTION OF THE DRAWINGS

Next, example embodiments will be described with reference to the appended drawings, wherein.

Hereinafter, reference will be made to the appended drawings. It should be noted that identical reference signs may be used to refer to identical or similar components.

DETAILED DESCRIPTION

Figure 1:
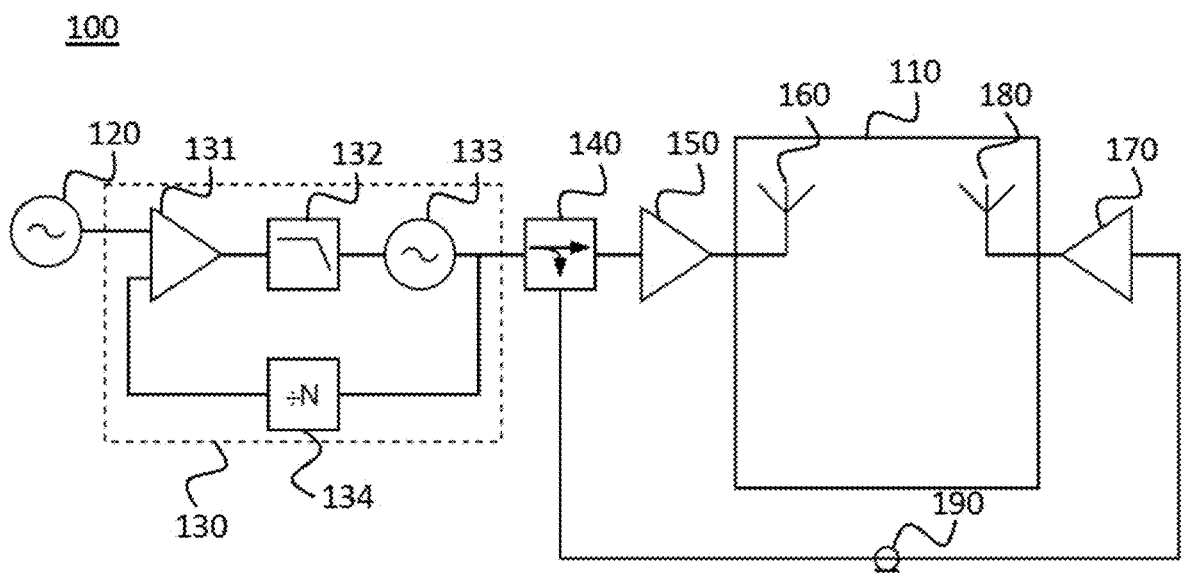
FIG. 1 is a schematic diagram showing a configuration of a multi-channel RF device with wired RF synchronization that is known from the prior art.

FIG. 1 shows an exemplary multi-channel RF device 100 known from the prior art having a cavity 110 and two RF channels. Device 100 is suitable for the drying, heating or cooking of products by placing the product in cavity 110 and by activating the device.

The first channel comprises an LO 120, a PLL 130, an RF splitter 140, a first amplifier 150 and a first antenna 160. The second channel comprises a second amplifier 170 and a second antenna 180. In device 100, an RF signal is generated using LO 120 and PLL 130. Then, using first and second antennas 160 and 180, EM fields are transmitted into cavity 110 to (uniformly) dry, heat and/or cook the product. For convenience, the modulation of the RF signals for steering said EM fields in cavity 110 is omitted from the figure.

In this configuration, LO 120 is configured to generate a reference signal, for example using a crystal oscillator, or an oscillator circuit such as a resonant tank circuit. Said reference signal is fed to PLL 130, which is configured to generate an RF signal using the reference signal from LO 120 as its input. Said RF signal is then split into a first and second RF signal by the RF splitter 140. The first and second RF signals both have a frequency identical to the RF signal generated by PLL 130. The first RF signal is fed to first amplifier 150 configured to amplify the first RF signal, and the amplified first RF signal is then transmitted into cavity 110 using first antenna 160. The second RF signal is fed to second amplifier 170 through a connection wire 190, e.g. a low-loss coaxial cable, and the amplified second RF signal is then transmitted into cavity 110 using second antenna 180. Since the first and second RF signals originate from the same RF signal, i.e. the output signal of PLL 130, frequency synchronization between the first and second channel is guaranteed.

PLL 130 comprises a phase detector 131, a low-pass filter (LPF) 132, a VCO 133 and a fractional divider 134. Phase detector 131 is configured to detect a phase difference between a first and second input signal at its first and second input, respectively, and to output a signal proportional to said phase difference. The first input signal of phase detector 131 is the reference signal generated by LO 120.

The output signal of phase detector 131 is fed to LPF 132, which filters said signal. Then, VCO 133 generates an RF signal based on the output of LPF 132. Said RF signal is also the output of PLL 130. Finally, fractional divider 134 uses the RF signal to generate a signal having a frequency equal to the frequency of the RF signal divided by a factor N. The output signal of fractional divider 134 is then fed back to the second input of phase detector 131, such that fractional divider 134 forms a feedback network in PLL 130.

Due to the negative feedback configuration, the output signal frequency of VCO 133 is automatically adjusted in accordance with a phase difference between the inputs of phase detector 131. When the phase difference between the inputs of phase detector 131 remains zero, VCO 133 no longer adjusts its output signal frequency, and PLL 130 is said to have 'locked on' to the desired frequency. When PLL 130 has successfully locked, the output signal frequency is the factor N times the frequency of the reference signal. The desired frequency can therefore be configured by configuring the factor N of fractional divider 134.

RF splitter 140 splits the output RF signal of PLL 130 into a first and second RF signal having a frequency identical to that of the output signal of PLL 130. Said first and second RF signals are respectively amplified by first amplifier 150 and second amplifier 170 and are then respectively transmitted into the cavity using first antenna 160 and second antenna 180.

In this configuration, the synchronization between channels is achieved by sharing the output signal of PLL 130 with the second channel. This synchronization method specifically requires RF splitter 140 and connection wire 190. Since these components need to be operational in the RF domain, the implementation of said components can be expensive. The costs further increase for a multi-channel RF device in which the channels are spaced far apart from each other, or when more than one second channel is used, requiring an additional RF splitter and connection wire for each additional channel.

Figure 2:
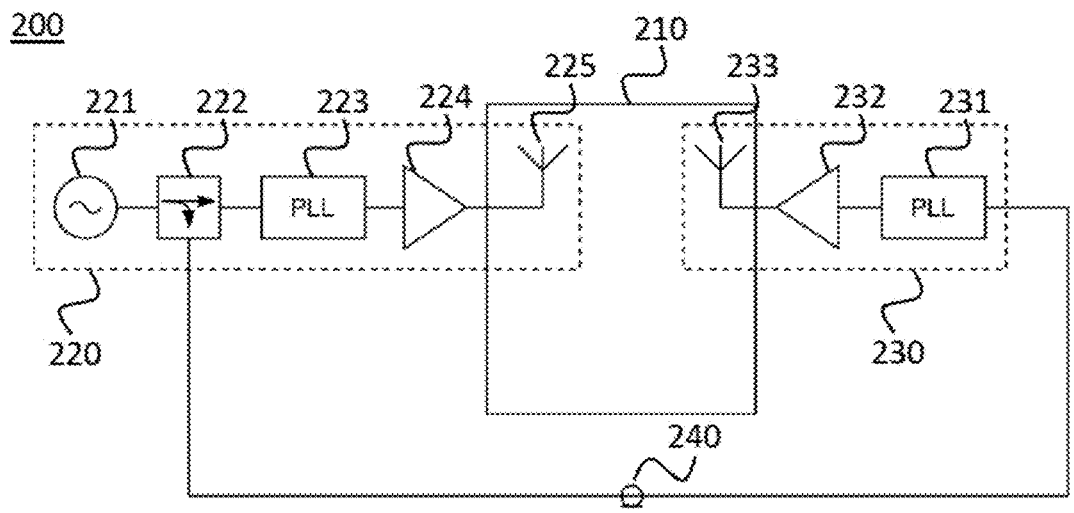
FIG. 2 is a schematic diagram showing a configuration of a multi-channel RF device with wired low-frequency synchronization that is known from the prior art.

FIG. 2 shows another exemplary multi-channel RF device 200 known from the prior art having a cavity 210, a first channel 220 and a second channel 230. Cavity 210 may be equivalent to cavity 110 of FIG. 1. In device 200, first channel 220 comprises an LO 221, an LF splitter 222, a PLL 223, an amplifier 224 and an antenna 225. Second channel 230 comprises a PLL 231, an amplifier 232 and an antenna 233.

In first channel 220, LO 221, which could be identical or similar to LO 120, is configured to generate a reference signal. Said reference signal is split into a first and second LO signal by LF splitter 222. The first LO signal is fed to the input of PLL 223, and the second LO signal is fed to the input of PLL 231 of second channel 230 through a connection wire 240, such as a low-loss coaxial cable.

PLLs 223 and 231 are configured to generate a first and second RF signal using the first and second LO signal, respectively. The first and second RF signals are then amplified by amplifiers 224 and 232, respectively, and transmitted into cavity 210 using antennas 225 and 233, respectively. In device 200, PLLs 240 and 250 are identical or similar to PLL 130 of FIG. 1. A detailed description thereof is therefore omitted.

Devices 100 and 200 differ in that in device 100 the output of PLL 130 is split using RF splitter 140, while in device 200 the output of the LO 221 is split into a first and second LO signal using an LF splitter 222. Consequently, contrary to device 100, second channel 230 of device 200 requires PLL 231 for generating the second RF signal.

Device 200 has the advantage over device 100 that LF splitter 222 and connection wire 260 need to be operational in the LF domain only, while RF splitter 140 and connection wire 190 must both be operational in the RF domain. For device 200, this therefore leads to reduced implementation costs relative to device 100. Nevertheless, additional hardware, i.e. a splitter and a connection wire, is required for each additional channel that is added to either of the devices 100 and 200. Furthermore, synchronization in device 200 is adversely affected if minute differences exist in the way PLLs 223, 231 lock to the frequency of the signal outputted by LO 221.

Figure 3:
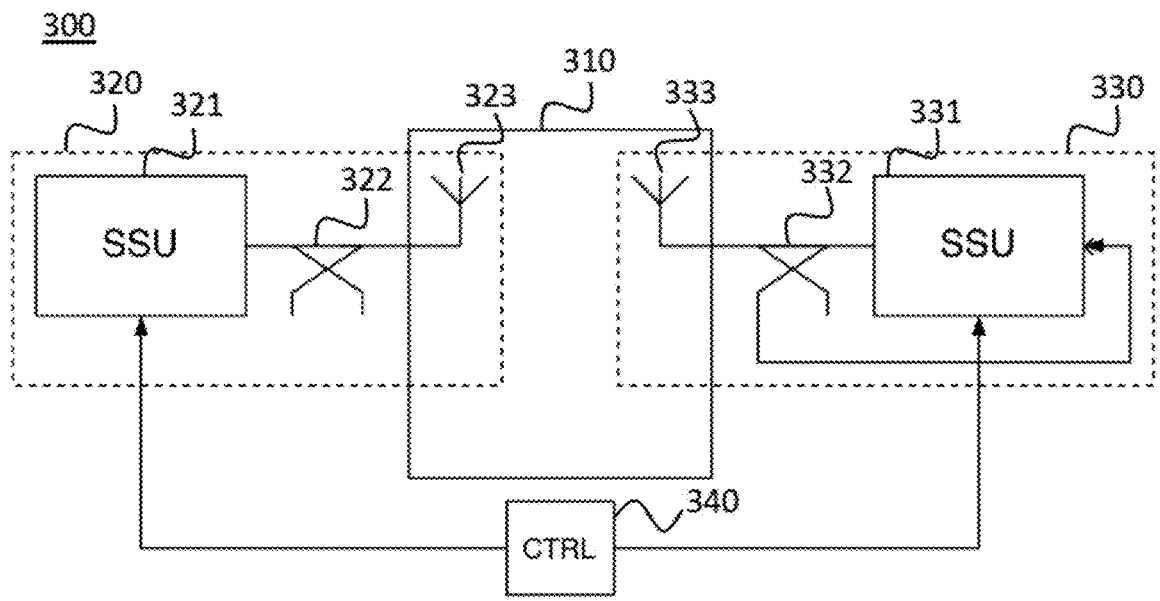
FIG. 3 is a schematic diagram showing a configuration of a multi-channel RF device according to some embodiments.

FIG. 3 shows an exemplary embodiment of a multi-channel RF device 300 having a cavity 310, which may be identical or similar to cavities 110 and 210, and a first channel 320 and second channel 330.

First channel 320 comprises a first signal synthesizer unit (SSU) 321 and a first antenna 323. Optionally, first channel 320 further comprises a first coupler 322, but is not limited thereto. In this configuration, first SSU 321 generates a first RF signal, which is then transmitted into cavity 310 using first antenna 323. If coupler 322 is present in first channel 320 then said coupler couples the first RF signal from first SSU 321 to first antenna 323. First channel 320 is configured to generate a first RF signal using first SSU 321, and to transmit said first RF signal into cavity 210 using first antenna 323.

Second channel 330 comprises a second SSU 331, a coupler 332 and a second antenna 333. Coupler 332 is arranged such that second antenna 333 is coupled to the input of second SSU 331, and such that the output of second SSU 331 is coupled to second antenna 333. In other words, there is limited coupling, and preferably no coupling, from the output of second SSU 331 to the input of second SSU 331.

Second channel 330 wirelessly receives the first RF signal using second antenna 333 and couples, using coupler 332, said RF signal from second antenna 333 to the input of second SSU 331. Second SSU 331 then generates at its output, based on the first RF signal, a second RF signal having a frequency identical to that of the first RF signal. The second RF signal is then coupled from the output of second SSU 331 to second antenna 333 in order to transmit the second RF signal into cavity 310.

In the embodiment described above, synchronization between first and second channels 320 and 330 is achieved wirelessly. Therefore, no additional hardware is required for synchronization of device 300 compared to devices 100 and 200. This further simplifies extending the number of second channels to two or more, while devices 100 and 200 require a splitter and a connection wire for each additional second channel.

In some embodiments, first and second channels 320 and 330 may be configured to transmit a first and second modulated RF signal in order to steer the EM fields in cavity 310. For example, first and second SSUs 321 and 331 may be able to modulate the generated first and second RF signals prior to outputting said RF signals.

In some embodiments, device 300 is configured to be operational in a first mode and a second mode. For example, in the first mode, referred to as the synchronization mode, first channel 320 may be configured to transmit an unmodulated first RF signal, that is, a 'pilot tone', into cavity 310, and second channel 330 may receive said pilot tone using second antenna 333. Coupler 332 may couple the received first RF signal to the input of second SSU 331, after which second SSU 331 extracts a frequency of the received first RF signal, and generates a second RF signal having a frequency identical to that of the received first RF signal. In the second mode, referred to as the heating, cooking or drying mode depending on the application, first and second channels 320 and 330 may transmit the first and second RF signals, respectively, into cavity 310. Said first and second RF signals may be modulated by the first and second SSUs 321 and 331, respectively, but the present disclosure is not limited thereto. In an embodiment, the second RF signal is not transmitted into cavity 310 when device 300 is operating in the synchronization mode. For example, the second SSU 331 may prevent or limit outputting the second RF signal when device 300 is operating in the synchronization mode. In this manner, second antenna 333 will not receive signals that originate from reflections of the second RF signal.

In the context of the present disclosure, it may occur that, after a certain time period, first and second channels 320 and 330 are no longer sufficiently synchronized, for example due to a relative drift in frequency between the first RF signal generated by first SSU 321 and the second RF signal generated by second SSU 331. If a heating/drying time exceeds said time period, then it may be necessary to repeat the synchronization process. In that case, device 300 must operate again in the synchronization mode until first and second channels 320 and 330 are sufficiently synchronized again. Thereafter, device 300 may again operate in the second mode. Therefore, a single operation of device 300 may comprise a plurality of time intervals of operating in the synchronization mode and operating in the second mode. Hereinafter, the time frame associated with operating in the synchronization mode and directly thereafter operating in the second mode will be referred to as an operation segment.

In some embodiments, device 300 may further comprise a controller 340 configured to provide control signals to first and second channels 320 and 330, e.g. to first and second SSUs 321 and 331, respectively, and thereby control the operation of device 300. For example, the control signals provided by controller 340 may control first and second channel 320 and 330 to operate according to the operating mode of device 300.

Controller 340 may configure device 300 to operate in the synchronization mode by controlling first SSU 321 to generate a pilot tone, and by controlling second SSU 331 to prevent or limit the second RF signal from reaching second antenna 333. Furthermore, controller 340 may control device 300 to operate in the second mode by controlling first and second SSUs 321 and 331 to enable modulation of the first and second RF signals.

Figure 4:
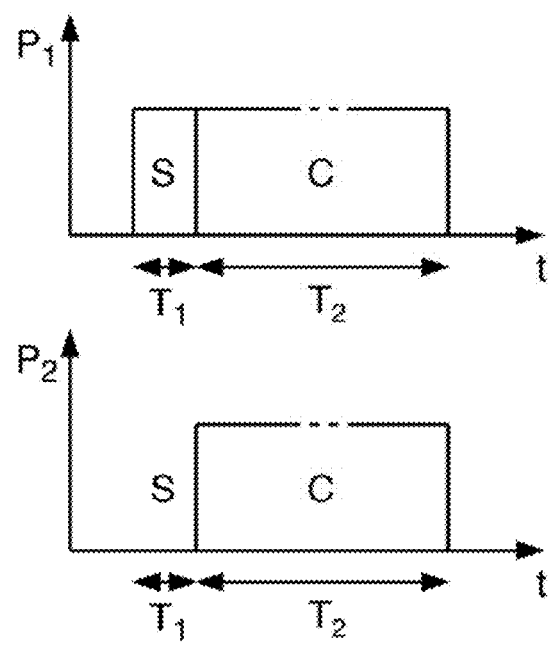
FIG. 4 is a timing diagram showing a segment of a heating or drying operation.

FIG. 4 illustrates a timing diagram of an operation segment for first and second channels 320 and 330 according to an embodiment. Here, $P_1$ denotes the output signal power of first channel 320, and $P_2$ denotes the output signal power of second channel 330. An operation segment comprises a synchronization mode time interval $T_1$ and a second mode time interval $T_2$.

In the synchronization mode, denoted by 'S', first channel 320 is transmitting a pilot tone as the first RF signal into cavity 310. Meanwhile, second channel 330 is not transmitting, but merely receiving the first RF signal, extracting a frequency of said signal, and generating the second RF signal based on the extracted frequency. This is seen in the timing diagram, where $P_2$ is zero in the synchronization mode.

In the second mode, denoted by 'C', first and second channels 320 and 330 are transmitting the first and second RF signal into cavity 310, respectively. Therefore, both $P_1$ and $P_2$ are non-zero throughout the duration of the second mode.

An operation is, within the context of the present disclosure, defined as a combination of one or more consecutive operation segments. In other words, within an operation, device 300 is alternately in synchronization mode S and second mode C.

In some embodiments, the total heating/drying time may be user-definable, that is, the user may define the combined sum of all second mode segments in an operation. The heating/drying time may be set based on the required time to dry, heat or cook a product in cavity 310. Furthermore, the synchronization mode time interval $T_1$ and/or the second mode time interval $T_2$ may be user-definable. For example, the user may define said time intervals such that $T_2$ is larger than $T_1$, as indicated in FIG. 4. However, the present disclosure is not limited thereto.

Figure 5A:
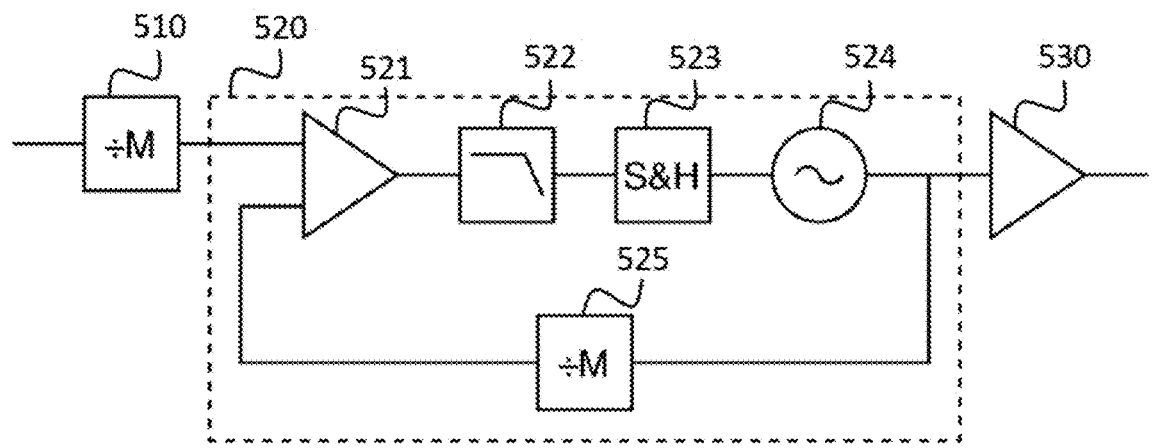
FIG. 5A is a schematic diagram showing a configuration of a first signal synthesizer according to some embodiments.

FIG. 5A shows the second SSU 331 according to some embodiments.

Second SSU 331 according to the embodiment of FIG. 5A comprises a first fractional divider 510, a switchable first PLL 520 and a first amplifier 530. First fractional divider 510, which receives a signal from coupler 332, is configured to generate a signal having a frequency equal to that of its input signal divided by a factor M. The output signal of first fractional divider 510 is fed to switchable first PLL 520, which generates the second RF signal based on said output signal of first fractional divider 510. The second RF signal is then amplified by first amplifier 530, of which the output forms the output of second SSU 331. Within the context of the present disclosure, switchable first PLL 520 performs the function of extracting the frequency of the signal inputted to second SSU 331 and generating an RF signal having a frequency identical to that of the signal inputted to second SSU 331.

First PLL 520 comprises a first phase detector 521, a sample-and-hold circuit 523, a first VCO 524 and a second fractional divider 525. Optionally, switchable first PLL 520 further comprises a first LPF 522.

First PLL 520 differs from PLLs 130 and 223 in that sample-and-hold circuit 523 allows first PLL 520 to be switchable between a sampling mode and a hold mode. For example, when sample-and-hold circuit 523 operates in the sampling mode, the operation of first PLL 520 is identical or equivalent to PLLs 130 and 223. However, when sample-and-hold circuit 523 operates in the holding mode, the operation of first PLL 520 is such that the output signal of VCO 524 is maintained irrespective of the input signal of second SSU 331. In other words, the loop of first PLL 520 is interrupted in the holding mode, and first VCO 524 generates the second RF signal based on the signal held at the output of sample-and-hold circuit 523.

In some embodiments, sample-and-hold circuit 523 may comprise a combination of a series-connected switch and a capacitor connected in between the input of first VCO 524 and ground. When operating in the sampling mode, e.g. when device 300 is operating in the synchronization mode, the switch is closed and the output of first LPF 522 is fed to first VCO 524 and the capacitor is charged. When operating in the holding mode, e.g. when device 300 is operating in the second mode, the switch is open, and the voltage received at the first VCO 524 is equal to the voltage over the capacitor. Due to a non-zero current flowing at the input of first VCO 524, the voltage over the capacitor will drift in time causing the frequency of the second RF signal to slowly deviate from the frequency of the first RF signal. By repeatedly synchronizing first and second channels 320 and 330, this problem can be alleviated.

Furthermore, in order for first PLL 520 to generate the second RF signal having a frequency identical to the received first RF signal, second fractional divider 525 of first PLL 520 must divide the signal frequency of its input signal by the same factor M as that of first fractional divider 510.

When device 300 is operating in the synchronization mode, transmission of the second RF signal should be prevented or limited. In some embodiments, this may be achieved by switching off the power supply of first amplifier 530, such that the second RF signal is not amplified by first amplifier 530. Alternatively, a switch (omitted from the figure) at the input of first amplifier 530 may connect the input of first amplifier 530 to either the output of first PLL 520, or to ground, e.g. through a resistor.

In some embodiments, second SSU 331 may be configured to modulate the second RF signal when device 300 is operating in the second mode. The second RF signal may be modulated by, for example, varying the gain and/or phase delay of first amplifier 530. Alternatively, the second RF signal may be modulated using one or two-point modulation in first PLL 520, which is a modulation technique known in the field. The second RF signal may also be modulated by mixing the second RF signal with a baseband signal prior to or after amplification, e.g. by using a mixer (omitted from the figure). Controller 340 may be configured to provide control signals to second SSU 331 in order to enable or disable modulation of the second RF signal in dependence of whether device 300 is operating in the synchronization mode or the second mode.

Figure 5B:
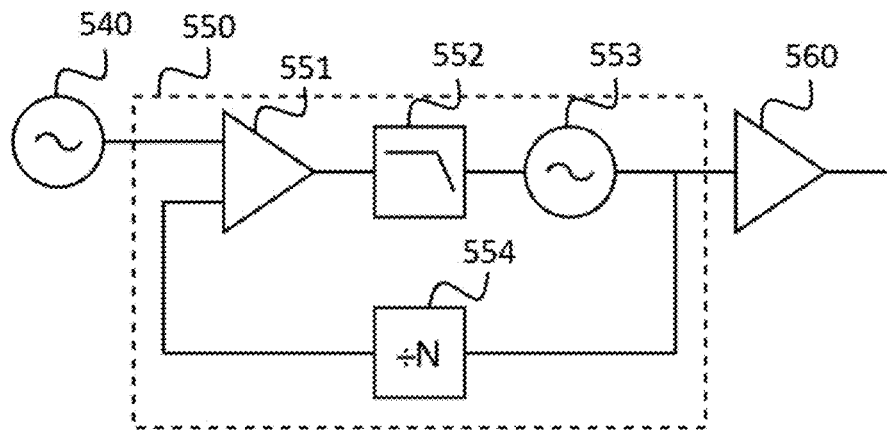
FIG. 5B is a schematic diagram showing a configuration of a second signal synthesizer according to some embodiments.

FIG. 5B shows the first SSU 321 according to some embodiments.

The first SSU 321 may comprise an LO 540, a second PLL 550 and a second amplifier 560. The operation of first SSU 321 may be equivalent or similar to the operation of a combination of LO 120, PLL 130 and first amplifier 150, or the combination of LO 221, PLL 223 and first amplifier 224. A detailed description thereof is therefore omitted.

In some embodiments, first SSU 321 may be configured to generate a pilot tone when device 300 is operating in the synchronization mode, and to modulate the first RF signal when device 300 is operating in the second mode. The first RF signal may be modulated by, for example, varying the gain and/or phase delay of second amplifier 560. Alternatively, the first RF signal may be modulated using one or two-point modulation in second PLL 550, which is a modulation technique known in the field. The first RF signal may also be modulated by mixing the first RF signal with a baseband signal prior to or after amplification by using a mixer (omitted from the figure). Controller 340 may be configured to provide control signals to first SSU 321 in order to enable or disable modulation of the first RF signal in dependence of whether device 300 is operating in the synchronization mode or the second mode.

Figure 6:
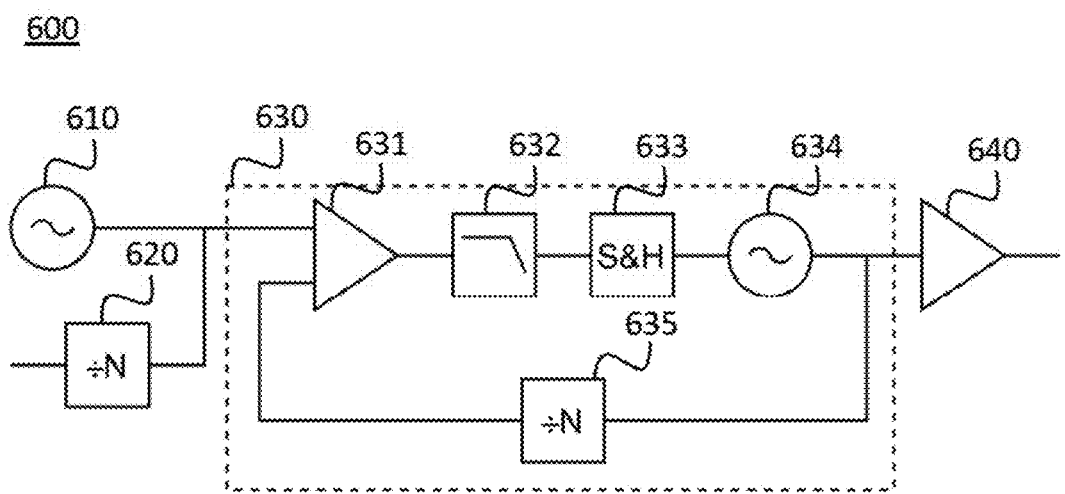
FIG. 6 is a schematic diagram showing a configuration of a general signal synthesizer unit according to an embodiment.

FIG. 6 shows a general SSU 600 (e.g., first SSU 321 or second SSU 331) according to another embodiment.

The general SSU 600 comprises an LO 610, which can be identical or similar to LO 540, a first fractional divider 620, which can be identical or similar to first fractional divider 510, a switchable PLL 630, which can be identical or similar to switchable first PLL 520, and an amplifier 640, which can be identical or similar to first or second amplifier 530 or 560.

Alternative to implementing a separate SSU circuit block for first and second channels 320 and 330, such as the embodiments of first and second SSUs 321 and 331 described in FIGS. 5A and 5B, respectively, a general SSU 600 circuit block can be used that can be configured to operate both as first SSU 321 and second SSU 331, albeit not simultaneously. In this manner, the number of different circuit blocks can be minimized. For example, general SSU 600 can be manufactured on a semiconductor die. In this manner, the same semiconductor dies can be used for first and second SSUs 321 and 331.

For the purpose of forming first SSU 321, sample-and-hold circuit 633 is set to the sampling mode irrespective of the mode of device 300, and first fractional divider 620 is disabled. First fractional divider 620 may for example be disabled by interrupting the signal path to the input of PLL 630, such as through the use of a switch (omitted from the figure).

For the purpose of forming second SSU 331, sample-and-hold circuit 633 is set to the sampling mode or the holding mode in dependence of whether device 300 is operating in the synchronization mode or the second mode, and LO 610 is disabled, e.g. through the use of a switch that interrupts the signal path to the input of PLL 630.

Controller 340 may provide control signals required to control and configure general SSU 600. For example, controller 340 may control general SSU 600 to form first SSU 321 by controlling sample-and-hold circuit 633 to be in the sampling mode, and by disabling first fractional divider 620. Furthermore, controller 340 may control general SSU 600 to form second SSU 321 by controlling sample-and-hold circuit 633 to be in the sampling mode or the holding mode in dependence of whether device 300 is operating in the synchronization mode or the second mode, and by disabling LO 610.

In some embodiments, general SSU 600 may be configured to modulate the RF signal outputted by PLL 630 when device 300 is operating in the second mode. The RF signal may be modulated by, for example, varying the gain and/or phase delay of amplifier 640. Alternatively, the RF signal may be modulated using one or two-point modulation in second PLL 630, which is a modulation technique known in the field. The RF signal may also be modulated by mixing the RF signal with a baseband signal prior to or after amplification by using a mixer (omitted from the figure). Controller 340 may be configured to provide control signals to general SSU 600 in order to enable or disable modulation of the first RF signal in dependence of whether device 300 is operating in the synchronization mode or the second mode.

In the above, the present invention has been explained using detailed embodiments thereof. However, it should be appreciated that the invention is not limited to these embodi-

What is claimed is:

1. A multi-channel RF device comprising:
a cavity;
a first channel configured to generate a first RF signal and to transmit the first RF signal into the cavity; and
a second channel spaced apart and electrically isolated from the first channel, wherein the second channel is configured to:
wirelessly receive the first RF signal transmitted by the first channel;
extract a frequency of the first RF signal from the received first RF signal;
generate, based on the extracted frequency, a second RF signal; and
transmit the second RF signal into the cavity.

2. The device according to claim 1, wherein the device is configured to be operational in:
a synchronization mode, wherein the first channel is configured to transmit a pilot tone as the first RF signal, and wherein the second channel is configured to receive the pilot tone and to extract the frequency of the pilot tone; and
a second mode, wherein the first channel is configured to transmit a first modulated RF signal as the first RF signal, wherein the first modulated RF signal relating to a first carrier signal having a frequency identical to the frequency of the pilot tone, wherein the first carrier signal is modulated to obtain the first modulated RF signal, wherein the second channel is configured to transmit a second modulated RF signal as the second RF signal, wherein the second modulated RF signal relating to a second carrier signal having a frequency identical to the extracted frequency of the pilot tone, and wherein the second carrier signal being modulated to obtain the second modulated RF signal.

3. The device according to claim 2, wherein the device is configured (i) to be alternately in the synchronization mode and the second mode and (ii) to be repeatedly in the synchronization mode during a single operation.

4. The device according to claim 3, wherein the synchronization mode is performed during a first time interval and the second mode during a second time interval, and wherein a combined sum of the second time intervals associated with the second mode during said single operation is user-definable.

5. The device according to claim 4, wherein at least one of the first time interval and the second time interval is user-definable.

6. The device according to claim 2,
wherein the first channel comprises a first signal synthesizer unit and a first antenna,
wherein the first signal synthesizer unit is configured to generate the first RF signal and to transmit the first RF signal into the cavity using the first antenna,
wherein the second channel comprises a second signal synthesizer unit and a second antenna,
wherein the second channel is configured to use the second antenna to wirelessly receive the first RF signal transmitted by the first channel when the device is operating in the synchronization mode, and
wherein the second signal synthesizer unit is configured to:
extract, in the synchronization mode, the frequency of the first RF signal from the received first RF signal;
generate, in the second mode and using the extracted frequency, the second RF signal; and
transmit, in the second mode, the second RF signal into the cavity using the second antenna.

7. The device according to claim 6, wherein the second channel further comprises a coupler electrically connected to an output of the second signal synthesizer unit, to an input of the second signal synthesizer unit, and to the second antenna, and wherein the coupler is configured to couple the received first RF signal from the second antenna to the input of the second signal synthesizer unit in the synchronization mode and to couple an output of the second signal synthesizer unit to the second antenna in the second mode.

8. The device according to claim 7, wherein the second signal synthesizer unit comprises a switchable first phase-locked loop (PLL) configured to:
generate, in the synchronization mode, the second RF signal by phase-locking to the signal received at the input of the second signal synthesizer unit; and
maintain, in the second mode, generating the second RF signal irrespective of the signal received at the input of the second signal synthesizer unit,
wherein the first PLL is preferably implemented as one of an analog PLL, an all-digital PLL (ADPLL), a field-programmable gate array (FPGA)-implemented PLL, a direct digital synthesizer (DDS), and a combination of a DDS and a PLL.

9. The device according to claim 8, wherein the second signal synthesizer unit further comprises a first fractional divider connected to an input of the first PLL, wherein the first fractional divider is configured to output, to the input of the first PLL, a signal having a frequency equal to the frequency of the signal received at the input of the second signal synthesizer unit divided by a factor M, and
wherein the first PLL comprises:
a first phase detector having a first and second input, and being configured to output a first phase error signal comprising a phase error between a first and second input signal received at the first and second input of the first phase detector, respectively;
a sample-and-hold circuit configured to sample the first phase error signal in the synchronization mode, and to hold the first phase error signal in the second mode;
a first voltage-controlled oscillator (VCO), configured to generate, in the synchronization mode, the second RF signal at an output of the first PLL using the sampled first phase error signal, and to generate, in the second mode, the second RF signal at the output of the first PLL using the held first phase error signal; and
a second fractional divider configured to output, using the second RF signal as its input, a signal having a frequency equal to the frequency of the second RF signal divided by the factor M,
wherein the first input signal of the first phase detector is the output signal of the first fractional divider, and wherein the second input signal of the first phase detector is the output signal of the second fractional divider, the first input of the first phase detector being identical or connected to the input of the first PLL.

10. The device according to claim 9, wherein the first PLL further comprises a first low-pass filter arranged in between an output of the first phase detector and the sample-and-hold circuit to generate a first filtered phase error signal using the first phase error signal, which is to be sampled or held by the sample-and-hold circuit.

11. The device according to claim 9, wherein the second signal synthesizer unit further comprises a first amplifier arranged in between the output of the first PLL and the coupler, wherein the first amplifier is configured for amplifying, in the second mode, the second RF signal before transmitting the second RF signal into the cavity using the second antenna.

12. The device according to claim 9, wherein the second signal synthesizer unit is configured to prevent or limit the second RF signal from reaching the second antenna in the synchronization mode, and wherein the first amplifier is configured to be shut down in the synchronization mode.

13. The device according to claim 11, wherein the second signal synthesizer unit is configured to modulate the second RF signal in the second mode, wherein the second signal synthesizer unit further comprises a mixer for mixing the second RF signal with a baseband signal in the second mode, and wherein the second signal synthesizer unit is configured to, in the second mode, vary a phase delay and/or an amplification of the first amplifier in dependence of a baseband signal.

14. The device according to claim 6, wherein the first signal synthesizer unit comprises:
- a local oscillator (LO), configured to generate a reference signal;
- a second PLL configured to generate the first RF signal using the reference signal; and
- a second amplifier configured to amplify the first RF signal and to output the amplified first RF signal to the first antenna,
- wherein the second PLL is preferably implemented as one of an analog PLL, an all-digital PLL (ADPLL), a field-programmable gate array (FPGA)-implemented PLL, a direct digital synthesizer (DDS), and a combination of a DDS and a PLL.

15. The device according to claim 14, wherein the second PLL comprises:
- a second phase detector having a first and second input and being configured to output a second phase error signal comprising a phase error between a first and second input signal received at the first and second input of the second phase detector, respectively;
- a second low-pass filter configured to generate a second filtered phase error signal using said second phase error signal;
- a second VCO configured to generate, at an output of the second PLL, the first RF signal using said second filtered phase error signal; and
- a third fractional divider configured to output, using the first RF signal as its input, a signal with a frequency equal to the frequency of the first RF signal divided by a factor N,
- wherein the first input signal of the second phase detector is the reference signal generated by the LO, and wherein the second input signal of the second phase detector is the output signal of the third fractional divider.

16. The device according to claim 15, wherein the reference signal generated by the LO has a signal frequency in a range between 1-100 MHz, preferably between 5-20 MHz, more preferably between 8-12 MHz, and wherein the frequency of the first RF signal is programmable by configuring the factor N of the third fractional divider.

17. The device according to claim 9, wherein the device comprises:
- a first semiconductor die on which a first integrated circuit block is realized, the first integrated circuit block comprising the second signal synthesizer unit and a local oscillator that is connected to the first input of the first phase detector; and
- a second semiconductor die on which a second integrated circuit block is realized that is identical to the first integrated circuit block,
- wherein, for the purpose of forming the first signal synthesizer unit, the first fractional divider is disabled, and the sample-and-hold circuit is set to the sampling mode only, and
- wherein, for the purpose of forming the second signal synthesizer unit, the local oscillator is disabled.

18. The device according to claim 6, wherein the first signal synthesizer unit is configured to modulate the first RF signal in the second mode, wherein the first signal synthesizer unit further comprises a mixer for mixing the first RF signal with a baseband signal in the second mode, and wherein the first signal synthesizer unit is configured to vary, in the second mode, a phase delay and/or an amplification of the second amplifier in dependence of a baseband signal.

19. The device according to claim 13, wherein the device comprises a controller for controlling the first signal synthesizer unit and the second signal synthesizer unit, wherein the controller is configured to (i) set the device in the synchronization mode by disabling the modulation of the first and second RF signals and (ii) set the device in the second mode by enabling the modulation of the first and second RF signals, wherein setting the device in the synchronization mode further comprises setting the sample-and-hold circuit in a sampling mode, and wherein setting the device in the second mode further comprises setting the sample-and-hold circuit in a holding mode.

20. The device according to claim 1, wherein the frequency of the first RF signal is configured to fall within an ISM radio band, preferably one of a range from 433.05-434.79 MHz, a range from 902-928 MHz, a range from 2.4-2.5 GHz, or a range from 5.725-5.875 GHz, and wherein the device comprises a plurality of said second channels.

* * * * *